(12) United States Patent
Ahrens et al.

(10) Patent No.: US 6,212,103 B1
(45) Date of Patent: Apr. 3, 2001

(54) METHOD FOR OPERATING FLASH MEMORY

(75) Inventors: Michael G. Ahrens, Sunnyvale; Anders T. Dejenfelt, San Jose; Qi Lin, Cupertino; Robert A. Olah, Sunnyvale, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/363,075

(22) Filed: Jul. 28, 1999

(51) Int. Cl.$^7$ .................................................. G11C 16/04
(52) U.S. Cl. .................. 365/185.29; 365/185.14; 365/185.24; 365/185.3
(58) Field of Search .............. 365/185.05, 185.14, 365/185.29, 185.27, 182.28, 182.24, 185.3

(56) References Cited

U.S. PATENT DOCUMENTS

| | | | |
|---|---|---|---|
| 5,222,040 | 6/1993 | Challa | 365/185 |
| 5,357,465 | 10/1994 | Challa | 365/185 |
| 5,400,276 * | 3/1995 | Takeguchi | 365/149 |
| 5,400,286 | 3/1995 | Chu et al. | |
| 5,592,415 | 1/1997 | Kato et al. | 365/185.01 |
| 5,629,892 * | 5/1997 | Tang | 365/185.2 |
| 5,896,314 * | 4/1999 | Chen | 365/185.01 |

OTHER PUBLICATIONS

Hitoshi Kume, Masataka Kato, Tetsuo Adachi, Toshihiro Tanaka, Toshio Sasaki, Tsutomu Okazaki, Naoki Miyamoto, Shun–ichi Saeki, Yuzuru Ohji, Masahiro Ushiyama, Jiro Yugami, Tadao Morimoto, and Takashi Nishida, "A 1.28um$^2$ Contactless Memory cell Technology for a 3V–Only 64Mbit EEPROM", International Electron Devices Meeting, 1992, pp. 24.7.1–24.7.3.

* cited by examiner

*Primary Examiner*—Vu A. Le
*Assistant Examiner*—Hien Nguyen
(74) *Attorney, Agent, or Firm*—Bever, Hoffman & Harms, LLP; Julie A. Stephenson; Lois D. Cartier

(57) ABSTRACT

A plurality of flash electrically erasable programmable read only memory (EEPROM) cells is disclosed wherein metal lines couple both the sources and the drains of the flash cells. Reading of these flash cells is accomplished by applying a positive voltage to the source and reading from the associated metal source line. A soft erase scheme for increasing the threshold voltage of over-programmed flash cells is provided that prevents the leakage caused by applying a positive voltage to the drain.

13 Claims, 10 Drawing Sheets

| Mode | Selected WL | Non-selected WL | $V_S$ | $V_D$ | $V_{PWELL}$ | $V_{NWELL}$ | Time |
|---|---|---|---|---|---|---|---|
| | $V_{CG}$ | $V_{CG}$ | | | | | |
| Program Low $V_t$ State (Selected BL) | -8.0 V | $V_{CC}$ - $V_t$ | Hi Z | +5.0 V | 0 V | $V_{CC}$ | 5.0 ms (per cell) |
| Program Inhibit (Non-selected BL) | -8.0 V | $V_{CC}$ - $V_t$ | Hi Z | 0 V | 0 V | $V_{CC}$ | |
| Erase High $V_t$ State | +8.0 V | +8.0 V | -8.0 V | Hi Z (-8.0 V from source) | -8.0 V | $V_{CC}$ | 100 ms (per cell) |
| Read | $V_{CC}$ | -2.0 V | +1.0 V | 0 V | 0 V | $V_{CC}$ | 20 ns |
| Soft Erase | $V_{CC}$ | $V_{CC}$ | -8.5 V | Hi Z | -8.5 V | $V_{CC}$ | 10 ms |

| Mode | Selected WL $V_{CG}$ | Non-selected WL $V_{CG}$ | $V_S$ | $V_D$ |
|---|---|---|---|---|
| Program Low $V_t$ State (Selected BL) | -15.0 V | 0 V | Hi Z | +5.0 V |
| Program Inhibit (Non-selected BL) | -15.0 V | 0 V | Hi Z | 0 V |
| Erase High $V_t$ State | +20.0 V | 0 V | 0 V | 0 V |
| Read | +3.0 V | -3.0 V | 0 V | +2.0 V |

| Mode | Selected WL $V_{CG}$ | Non-selected WL $V_{CG}$ | $V_S$ | $V_D$ |
|---|---|---|---|---|
| Program Low $V_t$ State (Selected BL) | -7.0 V | 3.3 V | Hi Z | 3.3 V |
| Program Inhibit (Non-selected BL) | -7.0 V | 3.3 V | Hi Z | 0 V |
| Erase High $V_t$ State | +12.0 V | 0 V | Hi Z or 0 V | 0 V |
| Read | +3.3 V | 0 V | 0 V | — |

FIG. 5C
(PRIOR ART)

| Mode | Selected WL $V_{CG}$ | Non-selected WL $V_{CG}$ | $V_S$ | $V_D$ | $V_{PWELL}$ | $V_{NWELL}$ | Time |
|---|---|---|---|---|---|---|---|
| Program Low $V_t$ State (Selected BL) | -8.0 V | $V_{CC} - V_t$ | Hi Z | +5.0 V | 0 V | $V_{CC}$ | 5.0 ms (per cell) |
| Program Inhibit (Non-selected BL) | -8.0 V | $V_{CC} - V_t$ | Hi Z | 0 V | 0 V | $V_{CC}$ | |
| Erase High $V_t$ State | +8.0 V | +8.0 V | -8.0 V | Hi Z (-8.0 V from source) | -8.0 V | $V_{CC}$ | 100 ms (per cell) |
| Read | $V_{CC}$ | -2.0 V | +1.0 V | 0 V | 0 V | $V_{CC}$ | 20 ns |
| Soft Erase | $V_{CC}$ | $V_{CC}$ | -8.5 V | Hi Z | -8.5 V | $V_{CC}$ | 10 ms |

METHOD FOR OPERATING FLASH MEMORY

FIELD OF THE INVENTION

The present invention relates to an electrically erasable programmable floating gate memory, such as flash memory or electrically erasable programmable read only memory (EEPROM) for both memory and programmable logic application. More specifically, the present invention relates to a method to implement high density and high speed flash memory with a single low voltage power supply.

BACKGROUND OF THE INVENTION

FIG. 1 is a schematic diagram of an array 100 of conventional flash memory cells (flash cells) detailed in U.S. Pat. Nos. 5,357,465 and 5,222,040. Array 100 includes flash cells 110–113, word lines 101–102, common source line 103, and drain bit lines 105–106, as illustrated.

In general, a non-volatile flash memory transistor (e.g., flash cell 110) includes a floating gate that can be programmed to store either a negative charge or a neutral charge. The amount of charge stored on the floating gate affects the threshold voltage of the flash cell. The threshold voltage of a flash cell is that voltage at which the flash memory transistor turns on, allowing full current to flow. When storing a negative charge, a flash cell is said to be in an erased state. When storing a neutral charge, a flash cell is said to be in a programmed state. When a flash cell is in the erased state, the negative charge stored on the floating gate prevents the flash cell from turning on at the low voltages used for reading the flash cell during a read operation. Therefore the erased flash cell is said to be in a high threshold state. When a flash cell is in the programmed state, the neutral charge stored on the floating gate allows the flash cell to be controlled by the voltage applied to the control gate of the flash cell. Therefore the programmed flash cell is said to be in a low threshold state.

FIG. 2 is a cross-sectional view of flash cell 110 of array 100. Flash cell 110 includes p-substrate 160, n-well 170, n-well contact 171, p-well 180, p-well contact 181, source 120, drain 130, tunnel oxide region 153, floating gate 154, isolation material 155, and control gate 156. Control gate 156 is conventionally word line 101, thereby coupling flash cell 110 to other flash cells in the array. The entire array of flash cells is fabricated within p-well 180, n-well 170, and substrate 160. The charge on floating gate 154 determines the threshold voltage of and identifies the state of flash cell 110.

FIG. 3 is a table describing the voltages for operating array 100. Array 100 can perform program, program inhibit erase, and read operations, as illustrated.

During the program mode, relatively high voltages are applied across the control gate (0 Volt) and the drain (+5 Volts) of flash cells on the non-selected word line and the selected drain bit line. These high voltages can result in drain disturb in erased cells. Drain disturb occurs when an electrical field is strong enough to cause the floating gate to experience a charge loss due to electron tunneling from the floating gate to the drain. It is therefore an object of the present invention to lessen the drain disturb in a flash array.

Minute variations in the size of the elements of a transistor can occur during transistor formation. As a result, some flash cells can have slightly thinner or thicker tunnel oxide regions. Electrons tunnel more easily through flash cells having thinner tunnel oxide regions during a program operation. As a result, flash cells having a thinner tunnel oxide region are less negatively charged during a program operation. These flash cells therefore have a lower threshold voltage than flash cells with thicker tunnel oxide regions. In some cases, the floating gate of a flash cell can lose enough charge to cause the threshold voltage of the flash cell to go negative. When this happens, a grounding voltage applied to the control gate does not turn off the flash cell. Cells with negative threshold voltages are called over-programmed cells. To conventionally prevent non-selected cells from turning on, a voltage more negative than the negative threshold voltage of the most over-programmed cell must be applied to each non-selected cell in the array. This large negative voltage causes a large voltage to be applied across the control gates and the drains of the non-selected flash cells in the array. This voltage can disturb the amount of charge on the floating gate of these flash cells under certain conditions. It is therefore another objective of the present invention to find a better way to prevent turn-on of non-selected, over-programmed cells.

A flash cell is erased by applying the voltages listed in FIG. 3 to the array for a given period of time. Erasing is performed in blanket mode, meaning that all cells in an array are erased simultaneously. An array of cells is erased by applying a large positive voltage (e.g., 20.0 Volts) to each control gate, and grounding each source, drain, and substrate. Under these conditions, electrons tunnel from the substrate to the floating gate. As a result, after erasing, all cells should be in a high threshold voltage state.

A row of flash cells is read by applying the voltages listed in FIG. 3 to the array for a given period of time.

The junction of the drain region and a well region of a flash cell is called a drain junction. For example, the drain junction of flash cell 100 is located between the drain region (e.g., drain 130) and the p-well (e.g., p-well 180). The drain junction of a flash cell is designed to provide efficient F-N tunneling between the floating gate and the drain during a program operation. This is accomplished by implanting a more heavily doped (e.g., N+) region that is under-lapping the floating gate. As a result of the under-lapping, a tunneling region is created. Due to this sensitivity, applying a positive voltage to the drain may cause F-N tunneling induced read disturb in non-selected erased cells in the array. Read disturb occurs when the charge on a floating gate is altered by a read operation. In this case, read disturb occurs when an electrical field is strong enough to cause the floating gate to experience a charge loss due to electron tunneling from the floating gate to the drain. The floating gate is therefore less negatively charged after the read operation, and thus the threshold voltage of the cell is lowered. It is therefore an object of the present invention to lessen the read disturb occurring to non-selected, erased cells.

As an additional result of the under-lap of the heavily doped region with the floating gate, applying a positive voltage to the drain also causes hot electron induced read disturb if the selected cell is in a programmed state. In this case, the read disturb occurs when an electrical field is strong enough to cause the electrons flowing between the source and the drain during the read operation to gain enough energy to jump through the tunnel oxide layer into the floating gate. As a result, the floating gate contains additional charge after the occurrence of the read disturb. It is therefore another object of the present invention to lessen the read disturb that can occur in selected, programmed cells during a read operation.

Each cell in array 100 (FIG. 1) has one metal line and one diffusion line. Drain bit lines 105 and 106 are metal bit lines, and common source line 103 is a diffusion line. Diffusion lines inherently have large leakage current as well as large resistance and capacitance delays. As a result, the conduction performance of diffusion lines essentially act as an efficient connector coupled to a resistor and a capacitor. The added resistance and capacitance on the line is called RC delay. The RC delay of the diffusion line delays current along the line, thus delaying accesses to memory array 100. It is therefore another object of the present invention to increase the access speed to a flash memory array.

FIG. 4 is a layout diagram containing flash memory array 100. Similar elements in FIGS. 1, 2, and 4 are labeled with similar reference numbers. The layout diagram of flash cell array 100 therefore contains word lines 101–102, common source line 103, drain bit lines 105–106, drain regions 130–133, and source regions 120–121.

FIG. 5A is a schematic diagram of another conventional array 500 of flash cells as described in U.S. Pat. No. 5,592,415. Array 500 includes flash cells 510–513, word lines 504–505, drain bit lines 506–507, and source bit lines 508–509. Bit lines 506–509 are buried diffusion lines.

FIG. 5B is an equivalent circuit of flash memory array 500. Each of buried diffusion lines 506–509 are represented as an efficient conducting line coupled to a resistor and a capacitor. As noted above, buried diffusion lines have an inherent RC delay. The amount of RC delay in an array is directly proportional to the length of the buried diffusion line. This RC delay makes it difficult to use large flash memory arrays connected by buried diffusion lines efficiently in high density flash memory. The delays caused by the length of the buried diffusion lines in large arrays are incompatible with the speed required in high density flash memory applications. To reduce the RC delay of the array, U.S. Pat. No. 5,592,415 provides many small arrays. The typical size of these small arrays is 32 by 32 sectors, where a sector is a block of flash cells. The smaller array has proportionally shorter buried diffusion lines, with proportionally smaller RC delay. However, each of the 32×32 sectors must be interconnected to function as a large array. The additional interconnection makes this design more complicated than the conventional flash memory array of FIG. 1.

FIG. 5C is a table describing the voltages for operating flash array 500. Flash array 500 is programmed, erased, and read in a manner similar to array 100. Buried diffusion drain bit lines 506–507 inherently provide a large drain junction area. The amount of leakage current during programming is proportional to the size of the drain junction area. As a result, flash array 500 experiences a large leakage current during a program operation. It is therefore another object of the present invention to lessen the drain leakage current during programming.

Flash array 500 is read by applying a voltage of 3.3 Volts to the selected word line (e.g., $WL_1$), a pre-determined positive voltage (e.g., 2.0 Volts) to the selected drain bit line (e.g., $BL_1$), and a grounding voltage of 0 volts to both the selected source bit line (e.g., $SL_1$) and the substrate. Under these circumstances, a programmed cell (e.g., flash cell 510) conducts current and an erased cell (e.g., flash cell 511) does not conduct current. Sense amplifiers coupled with drain bit lines 506–507 sense the voltage change on drain bit lines 506–507.

However, as mentioned above, the drain junction is designed to have efficient F-N tunneling. Therefore, as with the circuit of FIG. 1, applying a positive voltage to the drain also causes hot electron induced read disturb if the selected cell is in a programmed state. This hot electron induced read disturb causes the threshold voltage of the affected programmed flash cell to increase. As noted above, it is another objective of the present invention to lessen the read disturb of selected, programmed cells during a read operation.

Additionally, the manufacturing process for forming buried diffusion lines 506–509 is very complicated. This process is further complicated by the need to form many small 32×32 sectors rather than one large array. It is therefore another object of the present invention to provide a flash memory array using a relatively simple manufacturing process.

FIG. 6 is a layout diagram of flash cell array 500. Similar elements in FIGS. 5A, 5B, and 6 are labeled similarly. The layout diagram of flash cell array 500 therefore contains word lines 504–505, (diffusion) source bit lines 508–509, (diffusion) drain bit lines 506–507, and flash cells 510–513. Also included are isolation material 42, drain select transistor gate 45, additional word lines 47, source select transistor gate 49, and common source lines 50. Note that the drain select transistor gate 45 is located at the top of the array, and the source select transistor gate 49 is located at the bottom of the array. The distance between select transistor gates 45 and 49 impairs the ability to exchange the associated control lines.

SUMMARY

Accordingly, the present invention provides a flash cell array and a method of operating same. The flash cell array is formed such that within each column of non-volatile memory transistors, each interior transistor shares a source region with a non-volatile memory transistor in a first direction and each interior non-volatile memory transistor shares a drain region with a non-volatile memory transistor in a second direction. An interior transistor is a transistor within the array that is located between two other transistors. Each drain of each non-volatile memory transistor in the column is coupled with a first metal, and each source of each non-volatile memory transistor in the column is coupled with a second metal. Each control gate of each non-volatile memory transistor along a word line is connected to the word line.

The metal lines used to couple each drain and each source allow faster access to the flash memory array than the buried diffusion lines of the related art.

The flash memory array is read from the source bit line, rather than by the conventional method of reading from the drain bit line. Reading from the source bit line prevents the application of a positive voltage to the drain junction, and therefore lessens the resulting read disturb.

A soft erase scheme is provided to increase the threshold voltage of over-programmed cells after a program operation. Conventionally, a positive voltage is applied to the drain, and a grounding voltage of 0 Volts is applied to the source, control gate, and substrate. This conventional method discharges electrons on the floating gates of erased cells (cells having a high threshold voltage), thus lowering the threshold voltage of the affected erased cells.

The present invention will be more fully understood in view of the following description and drawings.

BRIEF DESCRIPTION OF THE DRAWINGS

FIG. 5C is a table showing operating voltages for the flash memory array of FIG. 5A;

DETAILED DESCRIPTION OF THE DRAWINGS

Figure 7:
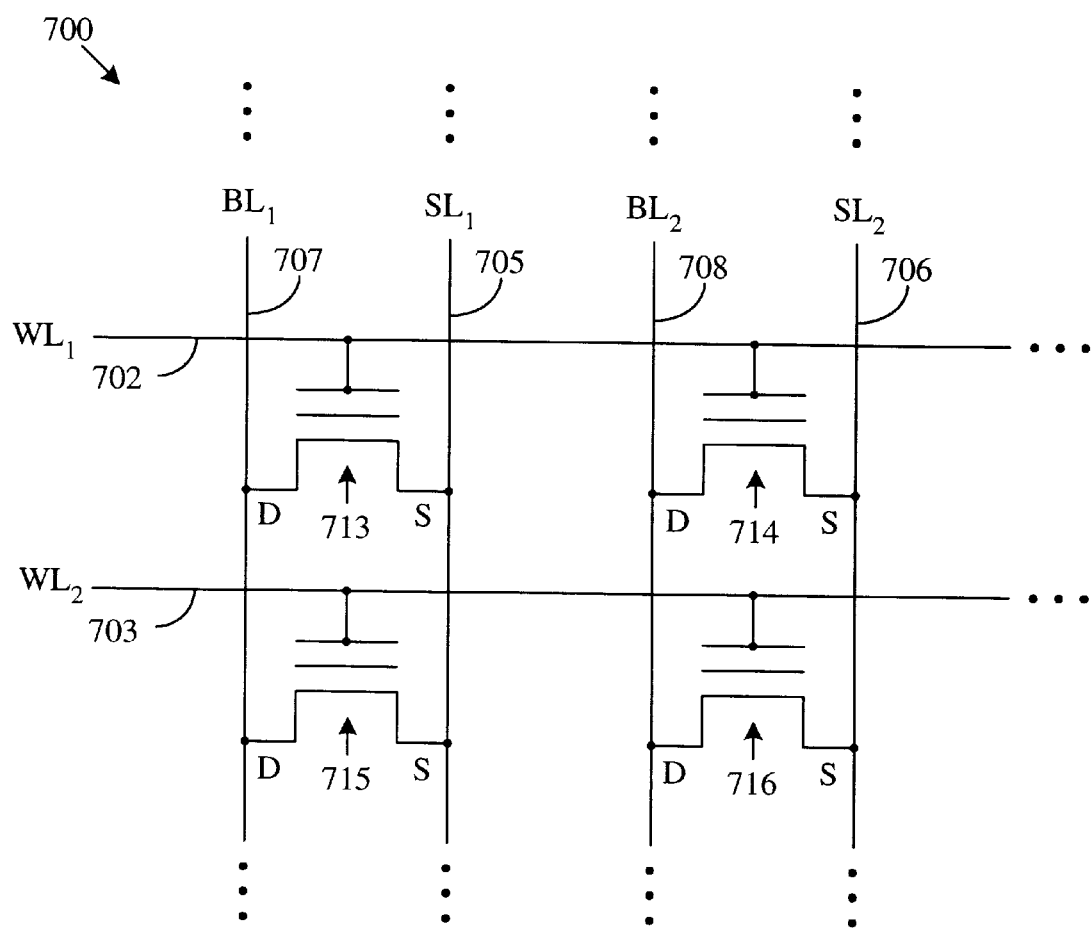
FIG. 7 is a schematic diagram of an array of flash cells in accordance with one embodiment of the present invention.

FIG. 7 is a schematic diagram of an array of flash cells 700 in accordance with one embodiment of the present invention. Array 700 includes flash cells 713–716, word lines 702–703, source bit lines 705–706, and drain bit lines 707–708. Flash cells 713–714 are commonly coupled to word line 702. Flash cells 715–716 are commonly coupled to word line 703. Flash cells 713 and 715 are commonly coupled to drain bit line 707 and source bit line 705. Flash cells 714 and 716 are commonly coupled to drain bit line 708 and source bit line 706. Bit lines 705–708 of flash array 700 are metal lines, as opposed to the diffusion bit lines of flash array 500 (FIG. 5A), which inherently have large RC delays and leakage currents. Therefore array 700 does not experience an RC delay as large as the RC delay of array 500.

Figure 5A:
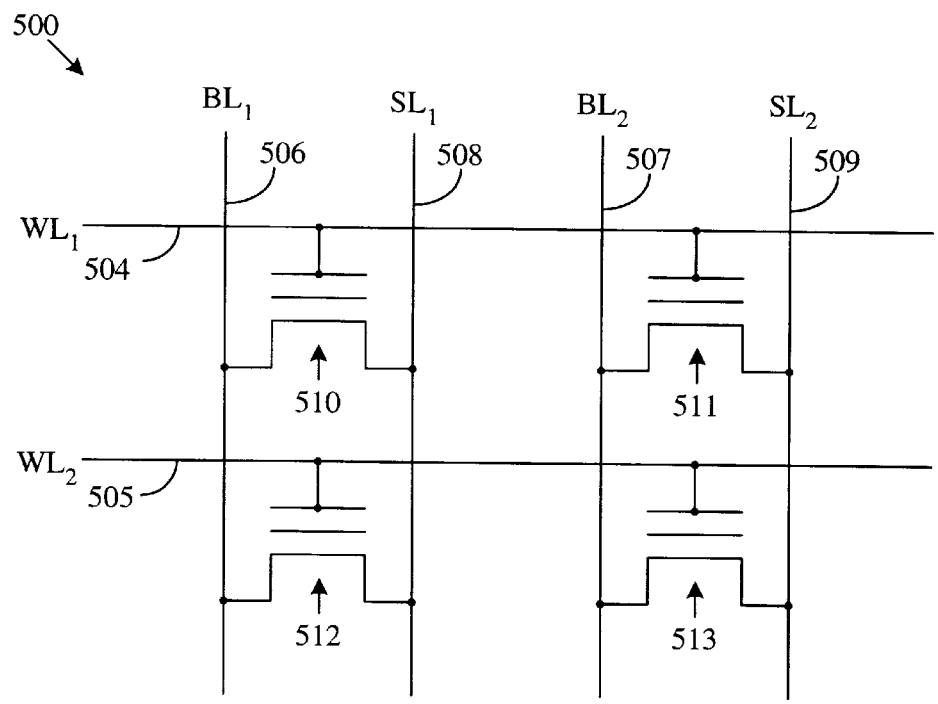
FIG. 5A is a schematic diagram of another conventional array of flash cells.

Although only four cells of array 700 are illustrated, it is understood that array 700 typically includes many more rows and columns of flash cells. (This is illustrated by dots " . . . " in FIG. 7). In one embodiment, array 700 is a NOR array. As described in more detail below, the layout of array 700 enables this array to have a much larger block size than prior art array 500 (FIG. 5A).

Figure 8:
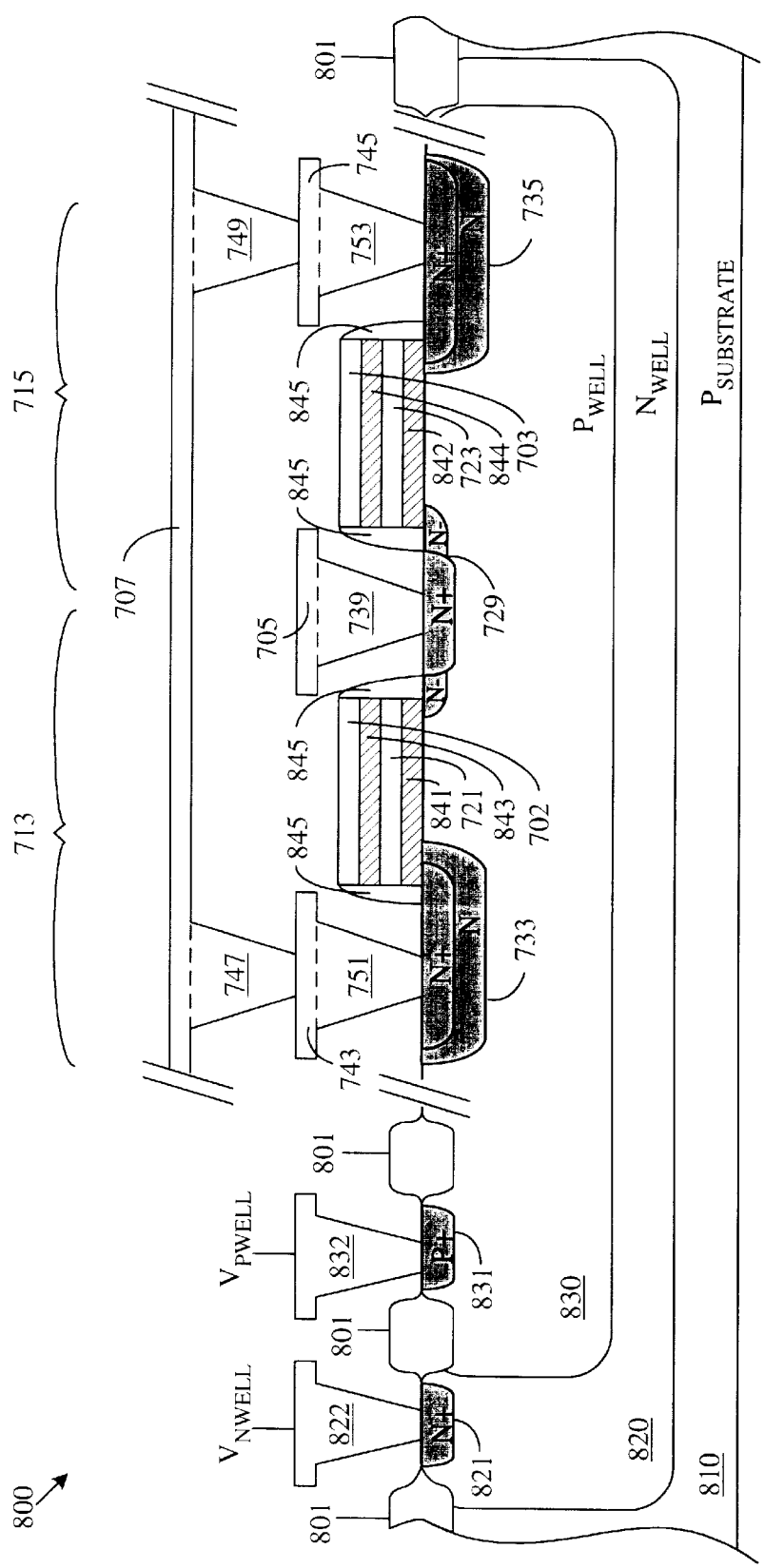
FIG. 8 is a cross sectional view of two flash cells in accordance with one embodiment of the present invention.

FIG. 8 is a cross sectional view of flash EEPROM cells 713 and 715 in accordance with one embodiment of the present invention. Similar elements in FIGS. 7 and 8 are labeled similarly. The flash cells 713 and 715 are fabricated on a monocrystalline semiconductor substrate 810. In the described example, substrate 810 is a p-type monocrystalline silicon having a boron dopant concentration of $10^{14}$ to $10^{15}$ cm$^{-3}$, although other types of semiconductor materials and other dopant concentrations can be used in other embodiments. An n-type well region (n-well) 820 is formed within substrate 810 as illustrated. In this embodiment, n-well 820 has a dopant concentration of about $10^{15}$ to $10^{16}$ cm$^{-3}$. A p-type well region (p-well) 830 is formed within n-well 820. P-well 830 has a dopant concentration of about $10^{16}$ to $10^{17}$ cm$^{-3}$. N-well 820 and p-well 830 are formed using conventional semiconductor processing techniques, such as ion implantation or diffusion. Field oxide layer 801 is formed over the upper surface of substrate 810 using conventional semiconductor processing techniques. In this embodiment, field oxide layer 801 is silicon oxide having a thickness of approximately 4500 Å.

Flash cell 713 is fabricated within p-well 830. Flash cell 713 is a stack-type double-poly transistor which includes source region 729, drain region 733, tunnel oxide film 841, floating gate 721, inter-poly dielectric layer 843, control gate 702, and spacers 845. Note that control gate 702 is a part of word line 702. Similarly, flash cell 715, also fabricated within p-well 830, includes source region 729, drain region 735, tunnel oxide film 842, floating gate 723, inter-poly dielectric layer 844, control gate 703, and spacers 845. Note that control gate 703 is a part of word line 703. Flash cells 713 and 715 share source region 729.

In this embodiment, tunnel oxide films 841–842 are silicon oxide (i.e., SiO$_2$) which are grown over the upper surface of p-well 830 to a thickness of approximately 80 to 100 Å. As described in more detail below, grown tunnel oxide films 841–842 facilitate Fowler-Nordheim (F-N) programming and erasing of flash cells 713 and 715. Additionally, spacers 845 are silicon oxide, and result from the oxide etching process. As shown in FIG. 8, drain regions 733 and 735 each include a portion with medium N doping (e.g., N) and a portion with heavy N doping (e.g., N+). These portions of drain regions 733 and 735 are doped prior to the oxide etching process that forms spacers 845. Note the heavily N doped portions of drain regions 733 and 735 extend underneath floating gates 721 and 723, respectively. This heavily doped under-lapping region allows efficient F-N tunneling of electrons during a program operation. Also shown in FIG. 8, source region 729 includes a portion with light N doping (e.g., N−) and a portion with heavy N doping (e.g., N+). The N− portion of source region 729 is doped prior to the formation of spacers 845. Note that the portion of source region 729 that extends underneath floating gate 721 is lightly N doped. However, the N+ portion of source region 729 is doped after the formation of spacers 845, and therefore the N+ portion of source region 729 does not under-lap floating gate 721 and 723. As a result, the source junction is inefficient for allowing F-N tunneling during a program operation. The source junction is located between source region 729 and p-well 830.

In this embodiment, floating gates 721 and 723 are formed from a lightly doped polycrystalline silicon layer which is deposited over tunnel oxide films 841–842, respectively, to a thickness of approximately 1000 to 3000 Å. As described in more detail below, floating gates 721 and 723 store charge to determine the logic state (i.e., programmed or erased) of flash cells 713 and 715, respectively.

Inter-poly dielectric layers 843–844 are formed from a dielectric layer (e.g., Oxide-Nitride-Oxide (ONO)) deposited over floating gates 721 and 723, respectively. An electrically conductive layer is then formed over the resulting structure. This conductive layer can be, for example, a layer of conductively doped polycrystalline silicon or a layer of polycide. Polycide includes a layer of metal (e.g., tungsten) or a layer of metal silicide (e.g., tungsten silicide) deposited over a layer of conductively doped polycrystalline silicon. This conductive layer is patterned and etched to form control gate/word line 702 of flash cell 713 and control gate/word line 703 of flash cell 715.

The process of forming flash EEPROM cells 713 and 715 described above is called a stack-gate flash memory process. To form flash EEPROM cells 713 and 715 with this process, a few steps must be added to the standard CMOS process. For example, the step of forming floating gates 721 and 723 by depositing a lightly doped polycrystalline silicon layer over tunnel oxide films 841–842 must be added to the standard CMOS process. These additional steps required for the stack-gate flash memory process do not conflict with the standard CMOS process steps. Thus, the stack-gate flash memory process is compatible with the standard CMOS process. As a result, flash EEPROM cells 713 and 715 formed by the stack-gate flash memory process are easily embedded into circuits formed using the standard CMOS process.

P type contact region 831 is formed in p-well 830 using conventional semiconductor processing methods. As denoted by the 'P+' in FIG. 8, p type contact region 831 is heavily p doped. P-well contact region 831 has a dopant concentration of $10^{19}$ to $10^{20}$ cm$^{-3}$ in the described example.

N type contact region 821 is formed in n-well 820 using conventional semiconductor processing methods. As denoted by the 'N+' in FIG. 8, n type contact region 821 is heavily N doped. N-well contact region 821 has a dopant concentration of $10^{19}$ to $10^{20}$ cm$^{-3}$ in the described example.

Transistors 713 and 715 are connected as follows. Metal-1 contacts 751, 739, and 753 contact drain region 733, source region 729, and drain region 735, respectively, at the upper surface of the substrate. Metal-1 pads 743 and 745 are connected to contacts 751 and 753, respectively. Contact 739 is connected to a metal-1 line 705 that is connected to source regions associated with other flash cells (not shown) in the same column as flash cells 713 and 715. Metal-1 line 705 is shown in more detail in FIG. 9. In this manner, the source regions of the flash cells in array 700 are connected by metal bit lines.

The metal-1 layer also provides contacts 822 and 832 to n-well contact region 821 and p-well contact region 831, respectively. Metal-2 via plugs 747 and 749 contact metal-1 pads 743 and 745, respectively. Metal-2 via plugs 747 and 749 are connected by metal-2 line 707. In this manner, the drain regions of flash cells in a column of array 700 are connected by metal bit lines.

The above described interconnect structure is fabricated as follows. An insulating layer (not shown), which is doped with phosphorous and/or boron, is deposited over the above-described transistor structure to act as a contamination diffusion barrier and as an insulating layer. Contact holes (not shown) are patterned and etched by a conventional oxide etch in this doped insulating layer, thereby exposing a portion of regions 821, 831, 733, 729, and 735. A first electrically conductive layer (metal-1), typically aluminum or an aluminum alloy, is then deposited over the doped insulating layer and into the contact holes, thereby forming contacts to each of regions 821, 831, 733, 729, and 735. These resultant regions are shown as metal-1 contacts 822, 832, 751, 739, and 753. This first conductive layer is then patterned and etched by a conventional aluminum etch, thereby forming source bit line 705, and conductive pads 743 and 745.

Another insulating layer (not shown), which is doped with phosphorous and/or boron, is deposited over the resulting structure to act as a contamination diffusion barrier and as an insulating layer. Vias (not shown) are patterned and etched in this doped insulating layer, thereby exposing a portion of the first conductive layer at conductive pads 743 and 745. A second electrically conductive layer (metal-2), typically aluminum or an aluminum alloy, is then deposited over the second doped insulating layer, thereby forming via plugs 747 and 749 that contact the exposed portion of pads 743 and 745, respectively. This second conductive layer is then patterned and etched, thereby forming drain bit line 707. Electrically conductive connections are provided for p-type substrate 810 in an area which is not illustrated in FIG. 8.

Figure 9:
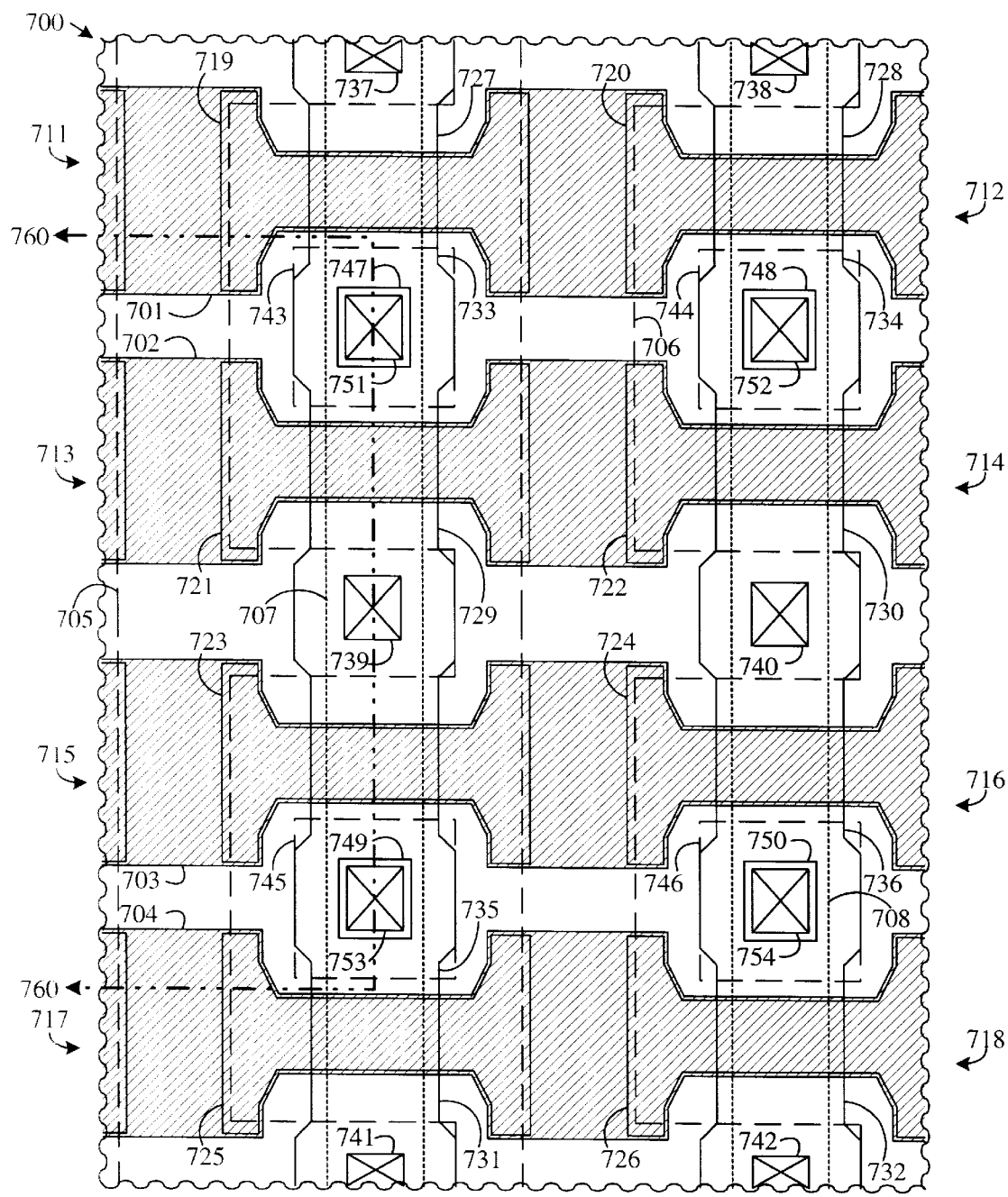
FIG. 9 is a layout diagram of an array of flash cells in accordance with one embodiment of the present invention.

FIG. 9 is a layout diagram of flash array 700, which includes flash cells 711–718 in accordance with one embodiment of the present invention. These flash cells are formed with source regions 727–732, drain regions 733–736, floating gates 719–726, and word line/control gates 701–704. Adjacent flash cells in the same column share source regions or drain regions. For example, flash cells 711 and 713 share drain region 733, and flash cells 713 and 715 share source region 729. This helps to provide an area-efficient layout pattern. Floating gates 719–726 are shaped in a fashion that maximizes the area of overlap between these floating gates and the overlying word line/control gates 701–704. Word line/control gates 701–704 extend in parallel across multiple columns of the array 700. Word line/control gates 701–704 are made wider in the areas between columns in order to increase the gate couple ratio of Flash cells 711–718 and minimize the resistance of the word line/control gates 701–704. Table 1 below identifies the various elements of flash cells 711–718.

TABLE 1

| Flash Cell | Source | Drain | Floating Gate | Control Gate |
|---|---|---|---|---|
| 711 | 727 | 733 | 719 | 701 |
| 712 | 728 | 734 | 720 | 701 |
| 713 | 729 | 733 | 721 | 702 |
| 714 | 730 | 734 | 722 | 702 |
| 715 | 729 | 735 | 723 | 703 |
| 716 | 730 | 736 | 724 | 703 |
| 717 | 731 | 735 | 725 | 704 |
| 718 | 732 | 736 | 726 | 704 |

The interconnect structure of array 700 is defined as follows. Metal-1 contacts 737–742 and 751–754 contact source/drain regions 727–736, respectively. Metal-1 contacts 751–754 are connected to metal-1 pads 743–746, respectively. Metal-1 pads 743–746 are shown in dashed lines.

Metal-1 contacts 737, 739, and 741 are connected to metal-1 source bit line 705, which is shown in dashed lines. As a result, metal bit line 705 is connected to the source region of each flash transistor in the first column of flash array 700. Similarly, metal-1 contacts 738, 740, and 742 are connected to metal-1 source bit line 706, which is shown in dashed lines. As a result, metal bit line 706 is connected to the source region of each flash transistor in the second column of flash array 700.

Metal-2 via plugs 747–750 contact metal-1 pads 743–746, respectively. Metal-2 via plugs 747 and 749 are connected to metal-2 drain bit line 707 (shown in short dashed lines). As a result, metal bit line 707 is connected to the drain region of each flash transistor in the first column of flash array 700. Similarly, metal-2 via plugs 748 and 750 are connected to metal-2 drain bit line 708 (shown in short dashed lines). As a result, metal bit line 708 is connected to the drain region of each flash transistor in the second column of flash array 700.

Because source bit lines 705–706 are fabricated in the first metal layer and drain bit lines 707–708 are fabricated in the second metal layer, these bit lines can be laid out in the area efficient manner illustrated in FIG. 9. Both sets of bit lines extend in parallel along the vertical axis of the array, with portions of drain bit lines 707–708 extending over portions of source bit lines 705–706. The layout of array 700 is more area efficient than the layouts of prior art arrays 100 and 500 of FIGS. 1 and 5A, respectively.

Figures 10, 11:
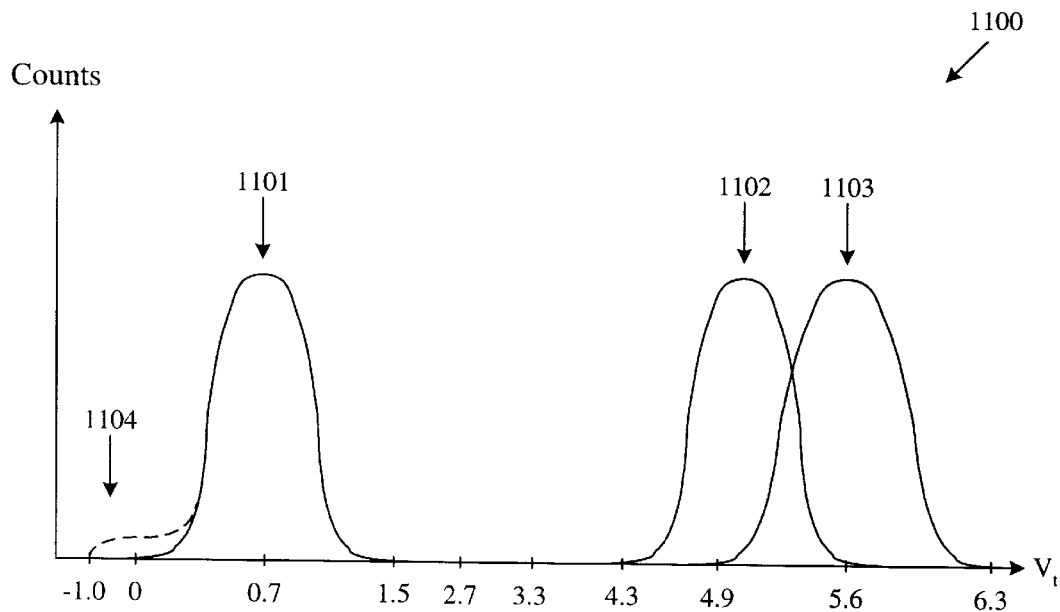
FIG. 10 is a table describing operating voltages flash cell array operation in accordance with one embodiment of the present invention.
FIG. 11 is a graph of flash cell threshold distribution in accordance with one embodiment of the present invention.

FIG. 10 is a table of voltages for operating the flash memory array 700 of FIG. 7. Array 700 is operated to perform program, erase, read, and soft erase functions in the manner described below.

Program Operation

A flash cell of array 700 is programmed by removing electrons from the floating gate of the flash cell, thereby leaving the floating gate with a neutral or positive charge.

Referring to FIGS. 7, 8, and 10 to program a specific flash cell, such as flash cell 713, a voltage of −8.0 Volts is applied to word line 702 (the selected word line), a positive voltage of 5.0 Volts is applied to drain bit line 707 (the selected drain bit line), and source bit line 705 is left floating for a given period of time (e.g., 5 ms per cell). Referencing FIG. 8, n-well 822 is held to the supply voltage VCC and p-well 832 is held to ground to prevent disturbance from the substrate. Under these conditions, a high electrical field is established in tunnel oxide region 841 between floating gate 721 and drain region 733. The strength of this electrical field is proportional to the differential voltage across control gate 702 and drain region 733. This high electrical field promotes tunneling of electrons from floating gate 721 to drain region 733. This tunneling of electrons, called Fowler-Nordheim tunneling, leaves floating gate 721 in a programmed state of neutral or positive charge.

Flash cell 715 is inhibited from programming as follows. Flash cell 715 is coupled to word line 703 (the non-selected word line) and selected drain bit line 707. During the programming of flash cell 713, non-selected word line 703 is held to a positive voltage equal to the supply voltage less the cell threshold voltage, $V_{cc}-V_t$. In this embodiment, the supply voltage $V_{cc}$ is equal to 3.3 Volts, and the threshold voltage $V_t$ is equal to 0.7 Volts. Thus, the resultant voltage applied to the control gates of the flash cells coupled to non-selected word line 703 is a positive voltage of 2.6 Volts. Referencing FIG. 8, the small voltage differential between control gate 703 and drain 735 produces a relatively weak electrical field in tunnel oxide 842. The strength of this electrical field is insufficient to program flash cell 715 in the period of time allowed for the programming operation.

Figure 1:
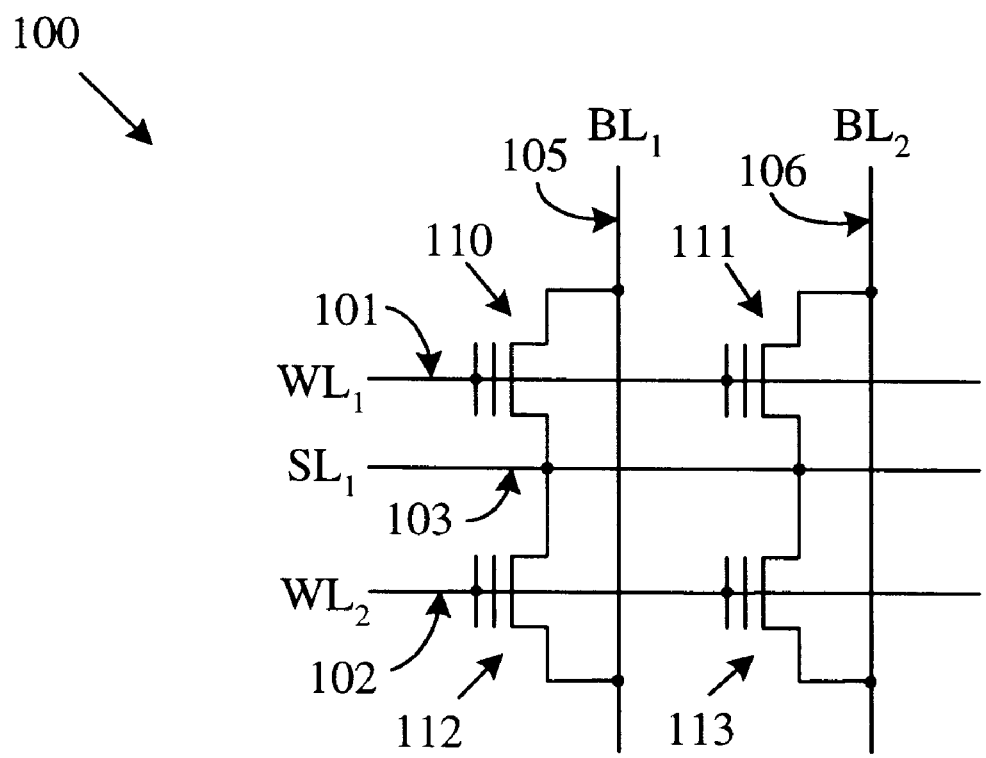
FIG. 1 is a schematic diagram of an array of conventional flash cells.
Figures 2, 3:
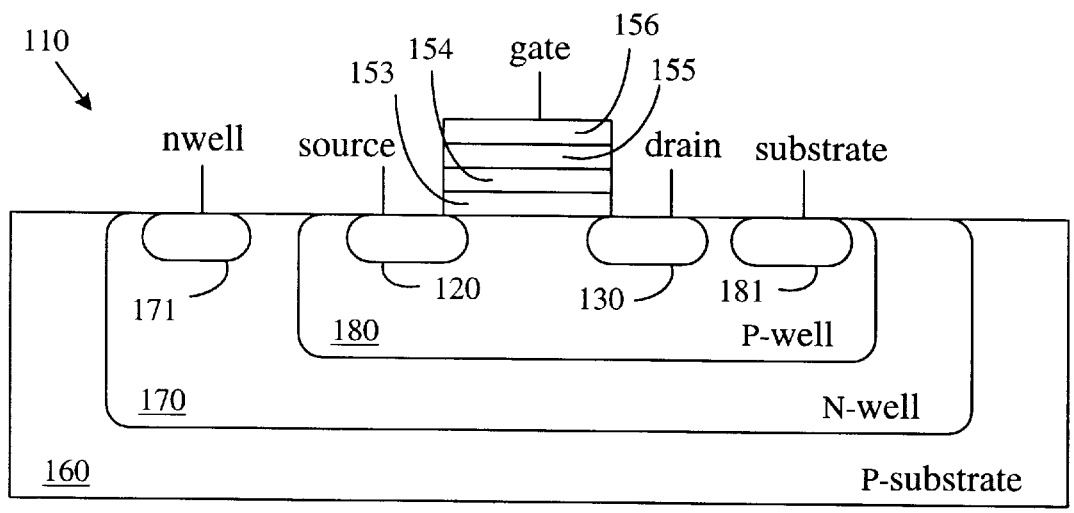
FIG. 2 is a cross-sectional view of the flash cells of FIG. 1.
FIG. 3 is a table showing conventional flash memory array operating voltages.
Figure 4:
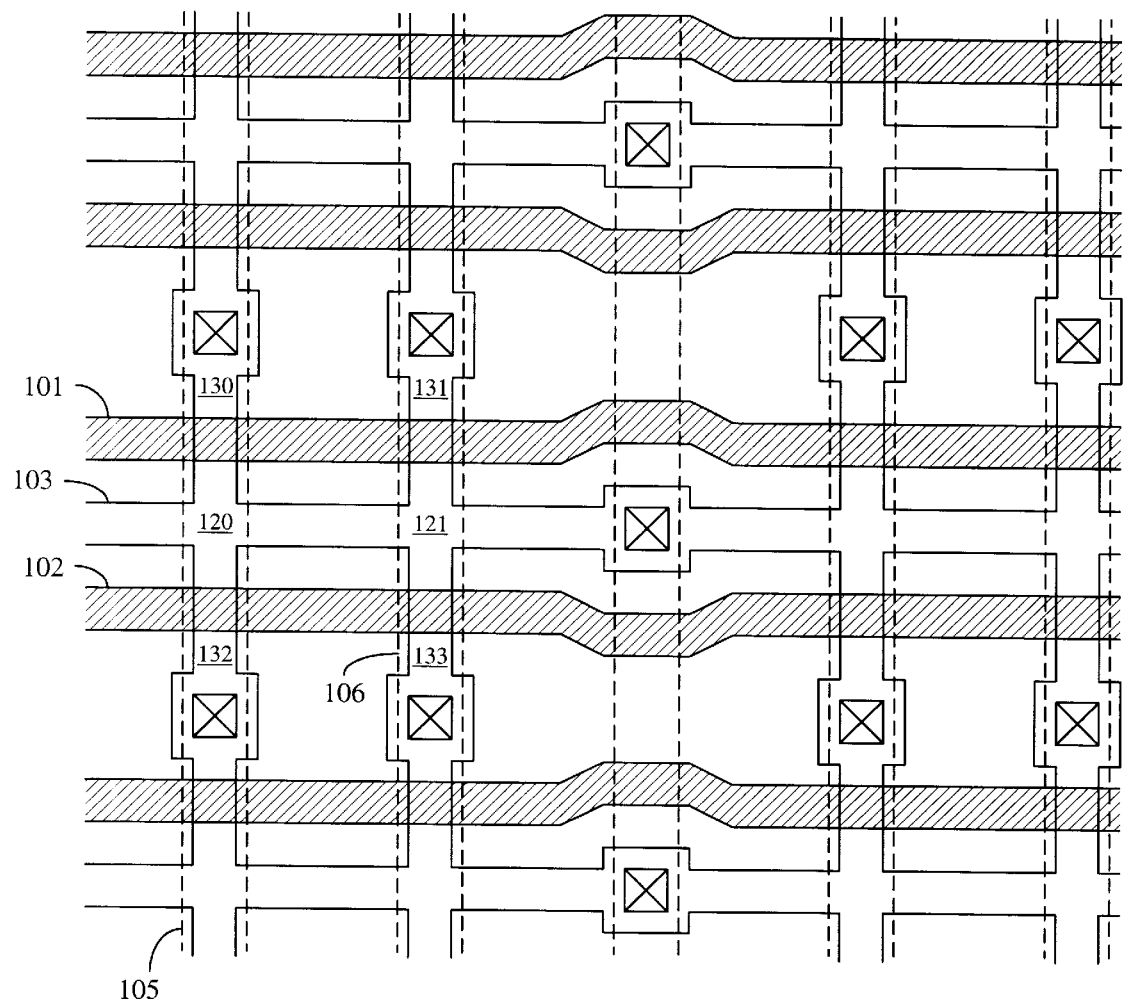
FIG. 4 is a layout diagram of the array of conventional flash cells of FIG. 1.

Note that this voltage of $V_{cc}-V_t$ is more positive than the 0 Volts used for the non-selected word line in prior art arrays 100 (FIG. 1). As a result, the voltage across control gate 703 and drain 735 of flash cell 715 (i.e. 5−2.6 Volts=2.4 Volts) is significantly less than that of prior art array 100. As a result, flash cell 715 of the present invention experiences proportionally less charge loss from floating gate 723 than is experienced by an equivalent prior art flash cell (See FIG. 1). Therefore, both drain disturb due to charge loss on the floating gate and band-to-band leakage current are reduced by the present invention.

Flash cells on the non-selected drain bit lines are held in program inhibit conditions during the program operation. For example, flash cell 714 is coupled to selected word line 702 (−8.0 Volts) and drain bit line 708 (the non-selected drain bit line). A voltage of 0 Volts is provided on non-selected drain bit line 708. As a result, a voltage of −8 Volts is applied across the control gate and drain of flash cell 714. This voltage is insufficient to program flash cell 714 during the program operation.

As another example, flash cell 716 is coupled to non-selected word line 703 (2.6 Volts) and non-selected drain bit line 708 (0 Volts). As a result, a voltage of 2.6 Volts is applied across the control gate and drain of flash cell 716. This voltage is insufficient to program (or erase) flash cell 716 during the program operation.

In contrast, a positive voltage cannot be applied to the non-selected word lines of prior art array 100 (FIG. 1) because common source line 103 is coupled to the same flash cells as word lines 101–102, thereby allowing a leakage current to flow through programmed cells. For example, assume cell 110 of FIG. 1 is being programmed, and cells 112 and 113 of FIG. 1 are programmed from a prior operation. To program cell 110, a large programming voltage of −8.0 Volts is applied to selected word line 101 and a voltage of +5.0 Volts is applied to drain bit line 105. If a positive voltage is applied to word line 102 to inhibit programming, cells 112 and 113 would turn on. Turned on cell 112 would couple drain bit line 105 to common source line 103. Turned on cell 113 would couple drain bit line 106 to common source line 103. Because drain bit line 105 is held at a voltage of 5.0 Volts and drain bit line 106 is held at a grounding voltage, a leakage current freely flows from drain bit line 105 to drain bit line 106. As a result, the voltage on drain bit line 105 can be pulled down to a voltage that prevents flash cell 110 from being programmed.

Figure 5B:
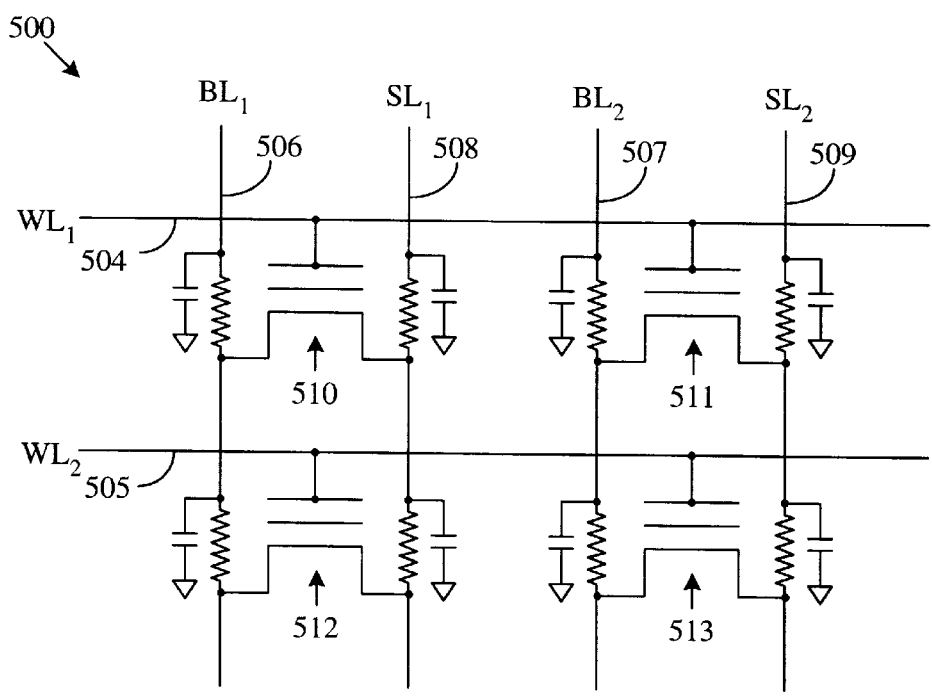
FIG. 5B is an equivalent schematic diagram of the array of flash cells of FIG. 5A.

Of importance, both the drain and source bit lines 705–708 of array 700 in the present invention (FIG. 7) are made of metal. By comparison, array 500 of FIG. 5 has both the drain and source bit lines formed as buried diffusion lines. The buried diffusion lines, as noted above, require a larger drain junction area than that of metal lines. The amount of drain junction current leakage is proportional to the size of the drain junction area. Thus, the smaller drain junction area of the present invention allows for less drain junction current leakage.

The other flash cells of array 700 are programmed in the same manner as flash cell 713.

Erase Operation

A flash cell is erased when electrons are inserted into the floating gate, thereby providing a negative charge on the floating gate. An array of flash cells of the present invention is erased by applying the voltages listed in FIG. 10 to array 700 for a given period of time (e.g., 100 ms). Erasing is performed in blanket mode, meaning that all cells in an array are erased simultaneously.

Flash memory array 700 is erased by applying a large positive voltage (8.0 Volts) to each control gate, a large negative voltage (−8.0 Volts) to each source, and leaving each drain floating. N-well 820 is held to a voltage equal to the supply voltage ($V_{cc}$) and p-well 830 is held to a large negative voltage (−8.0 Volts) to prevent electron flow from other regions. Under these conditions, a large voltage differential is established between each of the floating gates in array 700 and their associated source and p-well regions. This high voltage differential establishes a large electrical field which causes electrons to tunnel from the source and p-well regions to the associated floating gates. As a result, after erasing, all cells are in a high threshold voltage state.

Read Operation

Flash cells are read by applying the voltages listed in FIG. 10 to the array for a given period of time (e.g., 20 ns). Flash cells may be read cell by cell or row by row. A flash cell within row 1 of array 700 is read by selecting word line 702. Selected word line 702 is held to $V_{cc}$, source bit lines 705–706 are held to 1.0 Volts, and drain bit lines 707–708 are grounded. Source bit lines 705–706 are connected to sense amplifiers (not shown) to sense the change in current on the lines.

For example, flash cell 713 is read by selecting word line 702. Control gate 702 is held to the supply voltage of $V_{cc}$, drain 733 is grounded and source 729 is held to a voltage of 1.0 Volts. N-well 820 is held to a voltage equal to the supply voltage and p-well 830 is held to ground to prevent electron flow from the substrate.

Row 2 of array 700 is withdrawn from the read operation by not selecting word line 703. Specifically, non-selected word line 703 is held to a voltage of −2.0 Volts to turn off any over-programmed cells.

Under these conditions, the programmed cells in the selected row (those with a low threshold voltage) turn on and allow current to flow from the sources to the associated drains. This current is sensed by the sense amplifiers (not shown). Erased cells in the selected row (those with a high threshold voltage) do not turn on, thereby preventing the flow of current between the sources and the associated drains within the erased cells.

Read disturb occurs when the charge on the floating gate is altered by the read operation. As noted above, flash arrays 100 and 500 (FIGS. 1 and 5A) are read from the drain. As a result, read disturb in prior art arrays occurs when an electrical field is strong enough to cause the floating gate of an erased cell (having a high threshold voltage) on the non-selected word line and selected drain bit line to experience a charge loss due to electron tunneling from the floating gate to the drain. This charge loss is called F-N tunneling induced read disturb. The floating gate is therefore less negatively charged after the read operation, and thus the threshold voltage of the cell is lowered.

As noted above, the under-lap of the heavily doped drain region promotes efficient F-N tunneling between the drain and the floating gate. Therefore, a positive voltage applied to the drain induces more hot electron injection than would be induced by the same voltage if applied to the source. As a result, applying a positive voltage to the drain causes a larger read disturb if the selected cell (on selected word line and selected drain bit line) is programmed (at a low threshold voltage state). For a low threshold cell, the read disturb occurs when an electrical field is strong enough to cause the electrons flowing between the source and the drain to gain enough energy to jump through the tunnel oxide layer into the floating gate. As a result, the floating gate contains additional charge after the read operation. This charge acquisition is called hot electron induced read disturb.

Cells along the same word line within flash array 100 share the same source bit line. This prevents the sense amplifiers from distinguishing individual bits to be read within a row of flash cells. For this reason, flash array 100 may not be read from the source rather than the drain.

Figure 6:
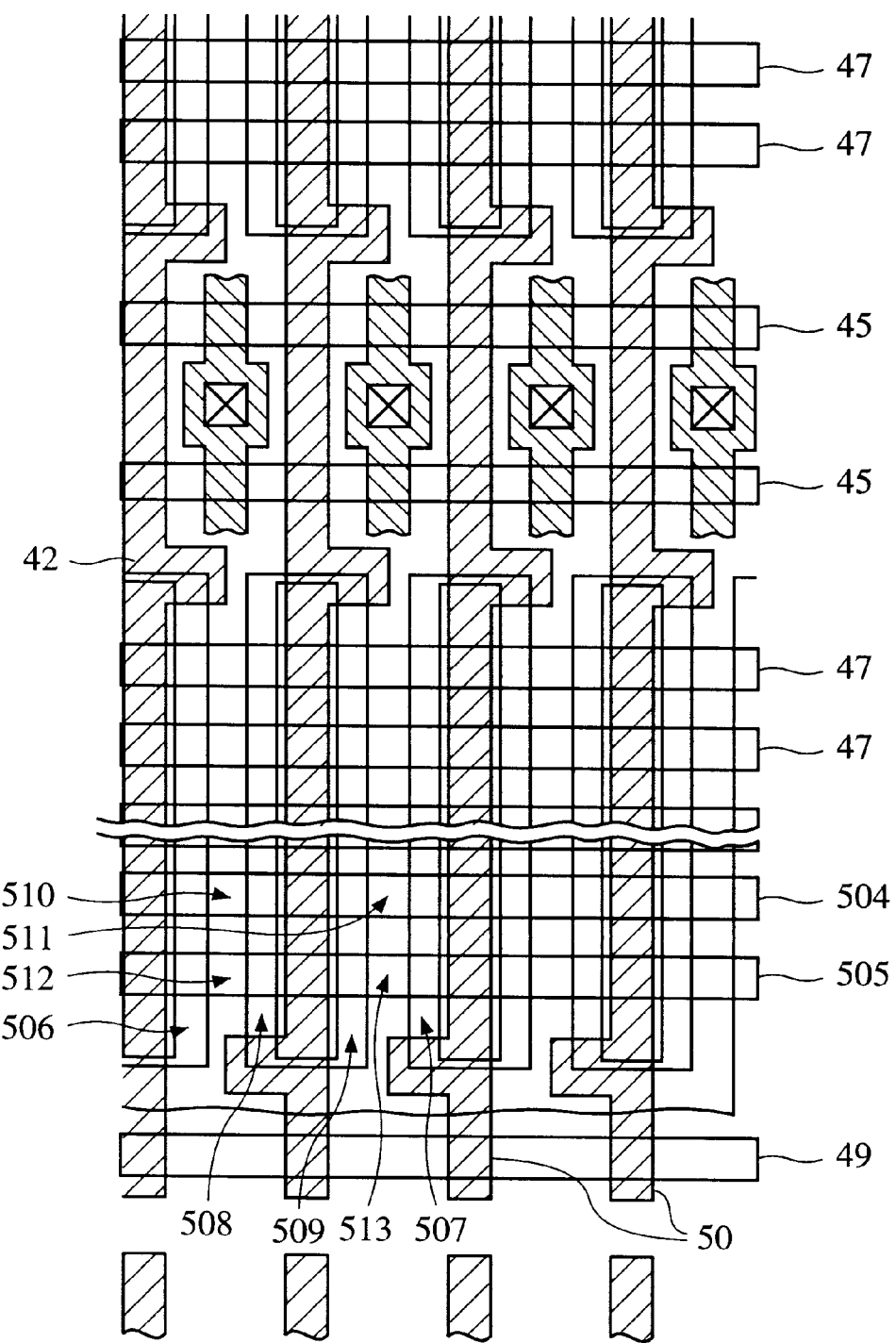
FIG. 6 is a layout diagram of the array of conventional flash cells of FIG. 5A.

The source line control select transistors 50 of array 500 (FIG. 5A) are placed at the bottom of each sector of cells and drain line control select transistors 45 at the top of each sector of cell, as shown in FIG. 6. These controls are not conveniently placed for exchanging functions during a read operation. For this reason, it is difficult for array 500 (FIG. 5A) to switch from the drain to the source during a read operation.

In the present invention, drain region is similarly optimized to provide efficient F-N tunneling between the control gate and the drain. However, the present invention is beneficially read from the source. Because the drain region provides more efficient F-N tunneling with the control gate than does the source region, reading from the source lessens both F-N tunneling induced and hot electron injection induced read disturb conditions. Thus, the present invention is not as susceptible to either type of read disturb caused by reading from the drain described above. Over time, repeated occurrences of read disturb lessen the useable lifetime of a flash cell. Therefore, the reduction of read disturb extends the useable lifetime of the flash cells of the present invention. In fact, the lifetime of flash cells of the present invention is one order of magnitude longer than the lifetime flash memory array 100 (FIG. 1).

Soft Erase Operation

FIG. 11 is a graph 1100 of flash cell threshold distribution in accordance with one embodiment of the present invention. Graph 1100 includes programmed cell distribution region 1101, erased cell distribution regions 1102–1103, and over-programmed cell distribution region 1104. All cells in an array are erased during an erase operation, thus all cells are in the erased state after the erase operation. Therefore, after an erase operation, all cells are in a high threshold state, as represented by erased cell distribution region 1103. As can be seen from FIG. 11, the threshold voltage of the erased cells ranges from approximately 4.9 to 6.3 Volts.

A program operation lowers the threshold voltages of the programmed cells. The programmed cell threshold distribution regions 1101 and 1104 represent this distribution of programmed cells after a program operation. Programmed cell distribution region 1101 represents the typically programmed cell. Over-programmed cell distribution region 1104 represents those cells over-programmed by the programming operation. As can be seen from FIG. 11, the threshold voltage of the typical programmed cell ranges from 0 to 1.5 Volts.

The conditions of the program operation slightly disturbs the contents of non-programmed cells. This disturbance tends to lessen the negative charge on the floating gates of the disturbed cells. As a result, the threshold voltages of these disturbed cells are lessened. Erased cell distribution region 1102 represents the distribution of erased cells after a program operation. As can be seen from FIG. 11, the voltage range for erased cells after a program operation is approximately 4.3 to 5.7 Volts.

As noted above, some cells are more sensitive to the program operation than others. These cells respond to the programming operations more quickly, and therefore become more depleted of electrons in their floating gates than the average cell. These over-programmed cells typically have a negative threshold after the program operation, and are represented by over-programmed cell distribution region 1104. As shown in FIG. 11, the over-programmed cells have a threshold voltage of approximately −1.0 to 0 Volts.

Over-programmed flash cells are turned on by the application of a grounding voltage to their control gates. Therefore, conventional flash memory arrays turn off over-programmed cells by applying a negative voltage to the appropriate word lines. Alternately, conventional flash memory arrays subject all flash cells to a soft erase function, which includes applying a positive voltage of about 5 Volts to the drain and to ground the source, gate, and substrate for a period of time. The positive voltage across the drain junction generates a high electrical field between the drain and the floating gate, causing electrons to be released from the floating gates. The present invention describes a method of handling these over-programmed cells. This method is to subject all cells to a soft erase mode after a programming operation.

The soft erase mode induces a large electrical field in the tunnel oxide layer for a brief duration. This strong electrical field causes electrons to enter the floating gate, thus increasing the threshold voltage of the cells. However, the brief duration (approximately 1/10th the duration of an erase operation) is not long enough to perform an erase of the cells. The short duration of the soft erase operation allows only those cells with quick response times to introduce a small number of electrons into their floating gates. Only the over-programmed cells, with their quick response times, are significantly altered. During this operation, the induced electrical field does not significantly change the threshold of other cells in the array.

For example, referring to FIGS. 8 and 10, a supply voltage of $V_{cc}$ is applied to control gate 702, control gate 703, and n-well contact region 821. Both p-well contact region 831 and source 729 are held to a negative voltage of −8.5 Volts, and drains 733 and 735 are left floating. The voltage differential between n-well contact region 821 and p-well contact region 831 ensures electrons do not flow into the system from the n-well junction. The n-well junction is located between n-well 820 and p-well 830. Under these conditions, the voltage differential between control gate 702 and p-well 830 causes an electrical field to form in tunnel oxide 841. If cell 713 is over-programmed, the charge on floating gate 721 is positive and the cell has a negative threshold value. Typically, the strength of the electrical field formed in the tunnel oxide region (e.g., tunnel oxide 841) is greater in over-programmed flash cells than in flash cells having a positive threshold voltage. The electrical field in tunnel oxide 841 causes electrons to tunnel through tunnel oxide 841 and enter floating gate 721, thus increasing the negative charge on the floating gate. The increased negative charge on floating gate 721 results in a higher cell threshold value.

This method of soft erase ensures that all resultant programmed cells have a positive threshold voltage less than a given value. Additionally, the soft erase operation tightens the threshold voltage distribution of programmed cells. The voltage differential is not across the drain junction, resulting in a very small leakage current during the new soft erase operation.

Array 100 (FIG. 1) uses one metal line per cell to couple the drains of each flash cell in a column. Array 500 (FIG. 5) uses two buried diffusion lines per cell to couple the drains and to couple the sources of each flash cell in a column, respectively. Array 700 (FIG. 7) uses two metal lines to couple each drain and to couple each source of flash cells in a column, respectively- As noted above, diffusion lines have an inherent delay due to the resistance and capacitance of the lines. Metal lines have much less resistance and capacitance delay. Therefore, the present invention allows faster access to the flash cells of array 700 than is allowed for arrays 100 and 500 (FIGS. 1 and 5A).

Additionally, the complexity of the formation process for a cell using buried diffusion lines is inherently more complicated than for a cell using metal lines because an additional step is required to form the buried diffusion lines. The present invention uses the standard EPROM tunnel oxide (ETOX) process, which is much less complicated. As a result, flash cells of the present invention may be embedded within CMOS circuits with only a minor change in the formation process.

A smaller flash cell size promotes a smaller overall chip size. Process technology is the method by which flash cells are fabricated. The feature size is used to delineate processes. Feature size is defined as the minimum width of pattern openings or spaces in a device. Therefore, a 0.35 µm process is a process in which the minimum width of pattern openings or spaces in a device is 0.35 µm.

For processes of 0.35 µm and above, the use of metal to connect both the drains and the sources of a cell increases the overall cell size as compared to cells using buried diffusion lines to connect one or both due to constraints of the ultra-violet (UV) lithography and etch equipment for the metal. However, the larger cell size required by the UV lithography and etch equipment constraints can be used to increase the cell coupling ratio, making the cell more efficient. The cell coupling ratio is the ratio between the amount of charge attracted into the floating gate versus the amount of voltage applied to the control gate. The cell coupling ratio is inversely proportional to the voltage required for program and erase operations. As a result, increasing the cell coupling ratio allows a lower voltage required for use during program and erase, and also increases the current produced during a read operation.

For processes of 0.25 µm and below, which use a deep-UV lithography and etch equipment, both cells using metal and cells using buried diffusion are similarly sized because the primary limitation on cell size is no longer the constraint of the UV lithography and etch equipment to process a metal line. The limitation at 0.25 µm and below is now the diffusion to diffusion distance and poly to poly distance. The diffusion to diffusion and poly to poly distances are set by the high voltage requirement of the flash cell. These distance limitations are larger than the limitation imposed by the use of metal process equipment, and thus each of arrays 100, 500, and 700 (FIGS. 1, 5A and 7, respectively) are limited by similar factors.

Although the present invention has been described in connection with one embodiment, it is understood that this invention is not limited to the embodiment disclosed, but is capable of various modifications which would be apparent to one of ordinary skill in the art. Thus, the invention is limited only by the following claims.

We claim:

1. A method of operating an array of one or more non-volatile memory transistors, each non-volatile memory transistor including a floating gate, a source, a drain, and a control gate, the method comprising:

an erase operation wherein electrons are inserted into the floating gate of each non-volatile memory transistor in the array by applying a first voltage across the control gate and the source of each non-volatile memory transistor for a first time period;

a program operation wherein electrons are removed from the floating gate of each non-volatile memory transistor in a first set of the array, thereby lowering the threshold voltage of each non-volatile memory transistor in the first set; and a soft erase operation performed after the program operation wherein electrons are inserted into the floating gate of each non-volatile memory transistor in the array by applying a second voltage across the control gate and the source of each non-volatile memory transistor for a second time period while leaving the drain of each non-volatile memory transistor floating, wherein the second voltage is less than the first voltage and the second time period is less than the first time period.

2. The method of claim 1, wherein the transistor array is located in a first well region, the soft erase operation further including applying a non-positive voltage on the first well region of the array of non-volatile memory transistors.

3. The method of claim 2, wherein the first well region is located within a second well region, the soft erase operation further including applying a positive voltage to the second well region of the array of non-volatile memory transistors.

4. The method of claim 1, wherein the program operation further includes applying a negative voltage to all control gates of the non-volatile memory transistors in the first set and applying a positive voltage to all control gates of the non-volatile memory transistors outside the first set, thereby lessening a programming disturbance occurring in the non-volatile memory transistors outside the first set.

5. The method of claim 1, further comprising a read operation wherein a positive voltage is applied to the source of a second set of one or more non-volatile memory transistors. in the array.

6. The method of claim 5, the read operation further including a positive voltage applied to the control gate and a grounding voltage applied to the drain of each of the second set of one or more non-volatile memory transistors during the read operation.

7. The method of claim 1, wherein the second time period is an order of magnitude less than the first time period.

8. The method of claim 1, wherein a voltage equal to a $V_{cc}$ voltage supply source is applied to the control gate of each non-volatile memory transistor during the soft erase operation.

9. The method of claim 1, wherein approximately the same voltage is applied to the source of each transistor during the erase and soft erase operations.

10. The method of claim 1, wherein the erase operation raises a threshold voltage of each non-volatile memory transistor in the array by a first incremental voltage and the soft erase operation raises the threshold voltage of each non-volatile memory transistor in the array by a second incremental voltage, wherein the second incremental voltage is less than the first incremental voltage.

11. The method of claim 1, wherein the erase operation is performed by Fowler-Nordheim tunneling.

12. The method of claim 1, wherein the program operation is performed by Fowler-Nordheim tunneling.

13. The method of claim 1, wherein the soft erase operation is performed by Fowler-Nordheim tunneling.

* * * * *